United States Patent
Fontana, Jr. et al.

(10) Patent No.: US 7,161,773 B2
(45) Date of Patent: Jan. 9, 2007

(54) HIGH LINEAR DENSITY TUNNEL JUNCTION FLUX GUIDE READ HEAD WITH IN-STACK LONGITUDINAL BIAS STACK (LBS)

(75) Inventors: Robert Edward Fontana, Jr., San Jose, CA (US); Kuok San Ho, Cupertino, CA (US); Tao Pan, San Jose, CA (US); Ching Hwa Tsang, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/075,079

(22) Filed: Mar. 7, 2005

(65) Prior Publication Data
US 2005/0146812 A1   Jul. 7, 2005

Related U.S. Application Data

(62) Division of application No. 10/054,352, filed on Jan. 18, 2002, now Pat. No. 6,888,705.

(51) Int. Cl.
*G11B 5/39* (2006.01)
*G11B 5/127* (2006.01)

(52) U.S. Cl. .................... 360/324.1; 29/603.15
(58) Field of Classification Search ............ 360/317, 360/324, 324.1, 324.12; 29/603.07, 603.13, 29/603.14, 603.15, 603.16
See application file for complete search history.

(56) References Cited

U.S. PATENT DOCUMENTS

| | | | |
|---|---|---|---|
| 5,712,565 A | 1/1998 | Schultz et al. | 324/252 |
| 5,712,612 A | 1/1998 | Lee et al. | 338/32 R |
| 5,729,410 A | 3/1998 | Fontana, Jr. et al. | 360/113 |
| 5,739,987 A | 4/1998 | Yuan et al. | 360/113 |
| 5,764,445 A | 6/1998 | Torng et al. | 360/113 |
| 5,780,176 A | 7/1998 | Iwasaki et al. | 428/692 |
| 5,867,889 A | 2/1999 | Dovek et al. | 29/603.13 |
| 5,898,547 A | 4/1999 | Fontana, Jr. et al. | 360/113 |
| 5,901,018 A | 5/1999 | Fontana, Jr. et al. | 360/104 |
| 5,909,344 A | 6/1999 | Gill | 360/113 |
| 5,910,344 A | 6/1999 | Hasegawa et al. | 427/599 |
| 5,930,087 A * | 7/1999 | Brug et al. | 360/324.2 |
| 5,946,167 A | 8/1999 | Hara et al. | 360/113 |
| 5,949,623 A | 9/1999 | Lin | 360/113 |
| 5,966,012 A | 10/1999 | Parkin | 324/252 |
| 5,993,566 A | 11/1999 | Lin | 148/108 |
| 5,995,339 A | 11/1999 | Koshikawa et al. | 360/113 |
| 6,005,753 A | 12/1999 | Fontana, Jr. et al. | 360/113 |
| 6,023,395 A | 2/2000 | Dill et al. | 360/113 |
| 6,030,753 A | 2/2000 | Lin | 430/314 |
| 6,033,491 A | 3/2000 | Lin | 148/108 |

(Continued)

FOREIGN PATENT DOCUMENTS

JP   10222819 A   *   8/1998

(Continued)

*Primary Examiner*—William J Klimowicz
(74) *Attorney, Agent, or Firm*—Bracewell & Giuliani LLP

(57) ABSTRACT

Several embodiments of a sense current perpendicular to the planes of the sensor (CPP) and flux guide type of read head has a gap between first and second shield layers at an air bearing surface (ABS) where the flux guide is located which is less than a gap between the first and second shield layers at a recessed location where the sensor is located. This reduced gap increases the linear bit density capability of the read head. A longitudinal bias stack (LBS) is located in the sensor stack. Several unique methods of construction are described for forming the magnetic head assemblies.

2 Claims, 17 Drawing Sheets

U.S. PATENT DOCUMENTS

| | | | |
|---|---|---|---|
| 6,052,261 A | 4/2000 | Watanabe et al. | 360/113 |
| 6,052,263 A | 4/2000 | Gill | 360/113 |
| 2002/0012205 A1* | 1/2002 | Ito et al. | 360/321 |
| 2002/0015251 A1* | 2/2002 | Ito et al. | 360/59 |
| 2003/0048584 A1* | 3/2003 | Song et al. | 360/319 |

FOREIGN PATENT DOCUMENTS

| | | | |
|---|---|---|---|
| JP | 10334418 A | * | 12/1998 |
| JP | 11316916 A | * | 11/1999 |
| JP | 2001291214 A | * | 10/2001 |

* cited by examiner

REMOVE 2ND MASK
DEPOSIT S2

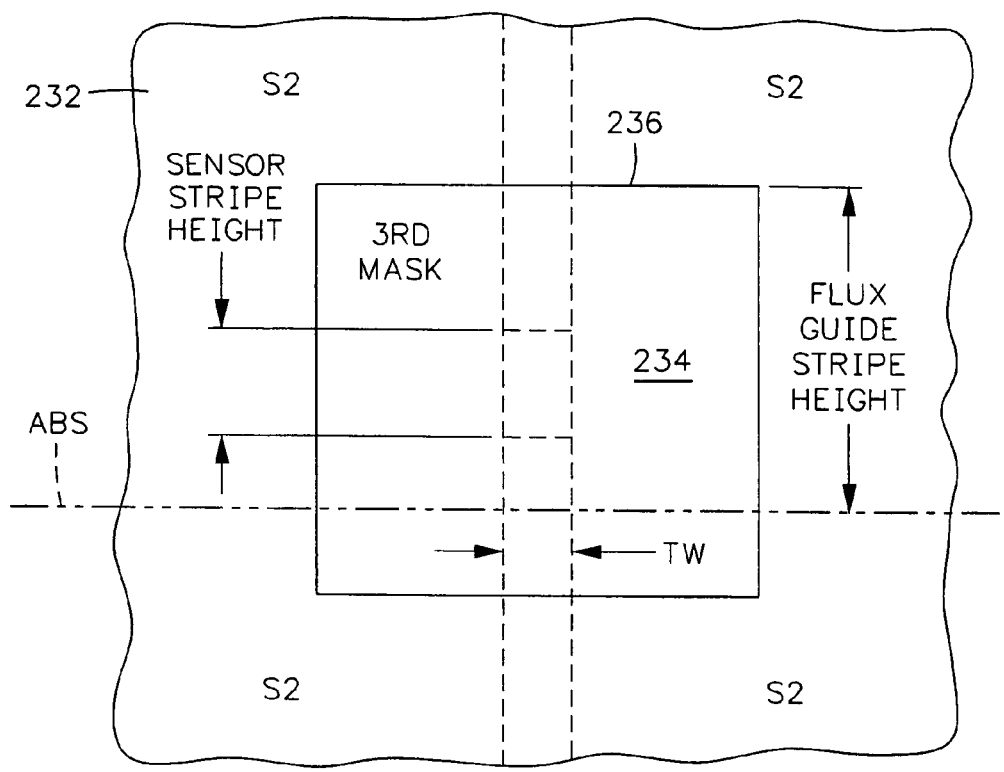
FIG. 17
ION MILL
REMOVE 3RD MASK
FIG. 18
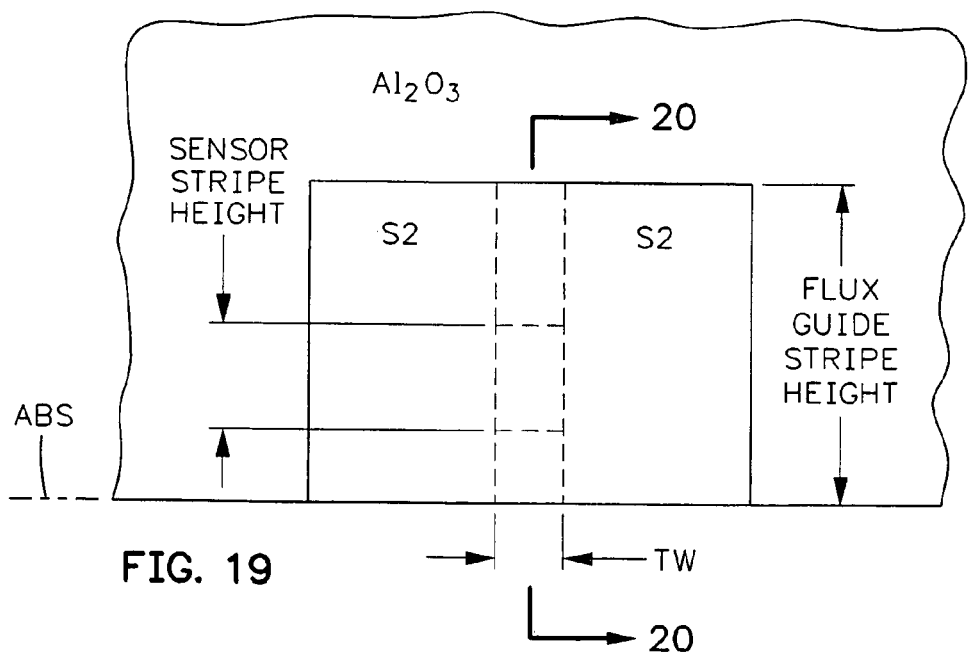
FIG. 19

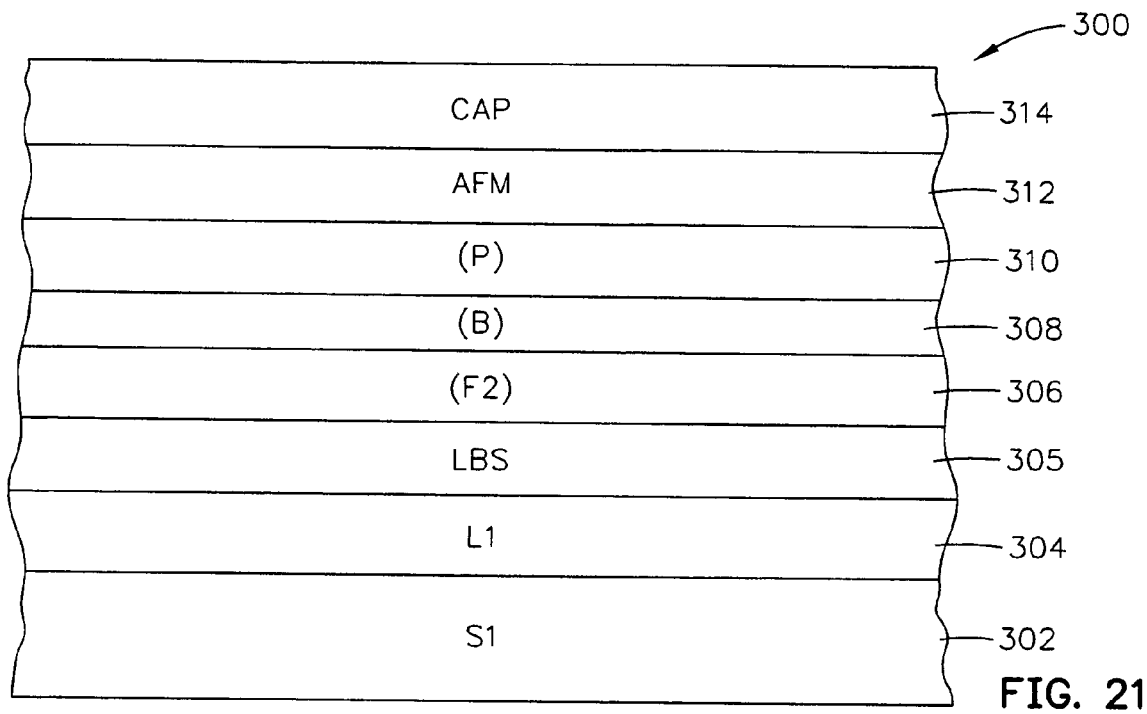
FIG. 21
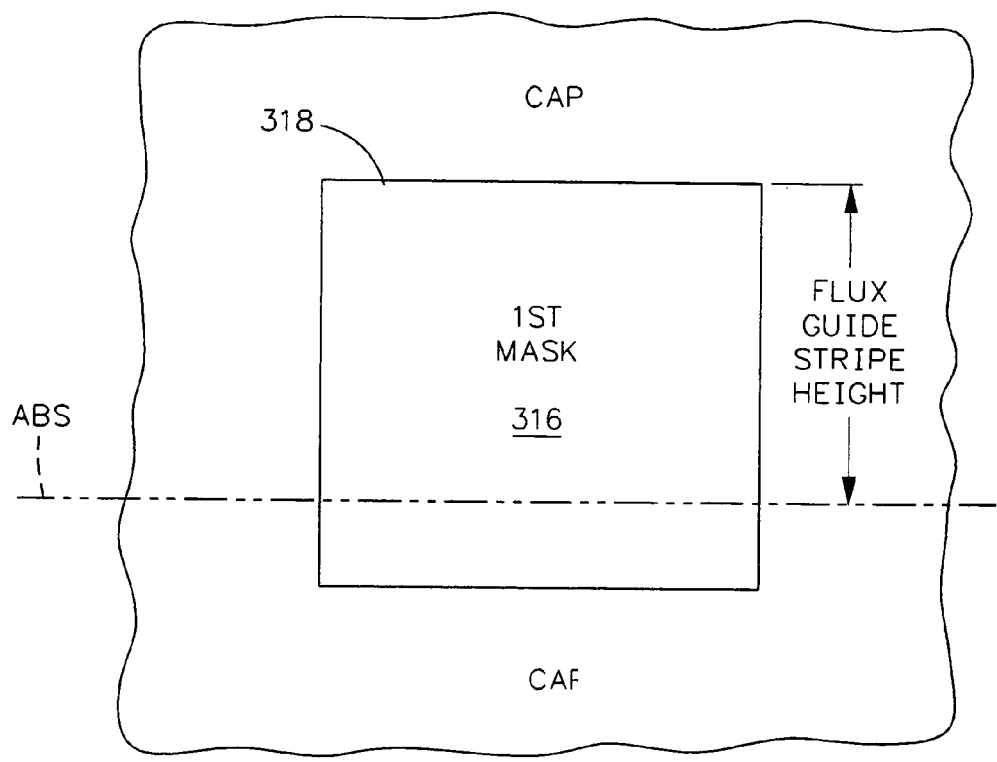
FIG. 22
ION MILL CAP
DEPOSIT ALUMINA
REMOVE 1ST MASK
FIG. 23

REMOVE 3RD MASK
DEPOSIT L2/S2

HIGH LINEAR DENSITY TUNNEL JUNCTION FLUX GUIDE READ HEAD WITH IN-STACK LONGITUDINAL BIAS STACK (LBS)

REFERENCE TO RELATED APPLICATION

This is a divisional of application 10/054,352 filed Jan. 18, 2002 now U.S. Pat. No. 6,888,705.

BACKGROUND OF THE INVENTION

1. Field of the Invention

The present invention relates to a high linear density tunnel junction read head with in-stack longitudinal bias stack (LBS) and, more particularly, to such a read head wherein the gap at an air bearing surface, where the flux guide is located, is smaller than the gap of a tunnel junction read head which is recessed from the ABS.

2. Description of the Related Art

The heart of a computer is a magnetic disk drive which includes a rotating magnetic disk, a slider that has read and write heads, a suspension arm above the rotating disk and an actuator arm that swings the suspension arm to place the read and write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic field signals from the rotating disk. The read and write heads are connected to processing circuitry that operates according to a computer program to implement the writing and reading functions.

An exemplary high performance read head employs a tunnel junction sensor for sensing the magnetic field signals from the rotating magnetic disk. The sensor includes a tunneling barrier layer sandwiched between a ferromagnetic pinned layer and a ferromagnetic free layer. An antiferromagnetic pinning layer interfaces the pinned layer for pinning the magnetic moment of the pinned layer 90° to an air bearing surface (ABS) wherein the ABS is an exposed surface of the sensor that faces the rotating disk. The tunnel junction sensor is located between ferromagnetic first and second shield layers. First and second leads, which may be the first and second shield layers, are connected to the tunnel junction sensor for conducting a tunneling current therethrough. The tunneling current is conducted perpendicular to the major thin film planes (CPP) of the sensor as contrasted to a spin valve sensor where a sense current is typically conducted in (parallel to) the major thin film planes (CIP) of the spin valve sensor. However, a spin valve sensor can be arranged so that the current is conducted perpendicular to the plane. Although the description below pertains to a tunnel junction sensor, the invention can also be employed with CPP spin valve sensors. A magnetic moment of the free layer is free to rotate upwardly and downwardly with respect to the ABS from a quiescent or zero bias point position in response to positive and negative magnetic field signals from the rotating magnetic disk. The quiescent position of the magnetic moment of the free layer, which is parallel to the ABS, is when the bias current is conducted through the sensor without magnetic field signals from the rotating magnetic disk. The sensitivity of the tunnel junction sensor is quantified as magnetoresistive coefficient dR/R where dR is the change in resistance of the tunnel junction sensor from minimum resistance to maximum resistance and R is the resistance of the tunnel junction sensor at minimum resistance.

In the prior art, the first and second shield layers or first and second lead layers may engage the bottom and the top respectively of the tunnel junction sensor so that the first and second shield layers or the first and second lead layers conduct the bias current through the tunnel junction sensor perpendicular to the major planes of the layers of the tunnel junction sensor. The tunnel junction sensor has first and second side surfaces which are normal to the ABS. First and second hard bias layers abut the first and second side surfaces respectively of the tunnel junction sensor for longitudinally biasing the magnetic domains of the free layer. This longitudinal biasing stabilizes the free layer and maintains the magnetic moment of the free layer parallel to the ABS when the read head is in the quiescent condition.

Except for the first and second shield layers, the flux guide is typically constructed separately from the tunnel junction sensor in order to satisfy the location of the flux conducting layer and one or more insulation layers. Typically, the first and second shield layers of the flux guide sensor are extensions of the first and second shield layers for the tunnel junction sensor. Accordingly, the first and second shield layers for the flux guide sensor at the ABS typically have the same gap therebetween as the first and second shield layers at the tunnel junction sensor. This means that the gap between the first and second shield layers at the ABS, and therefore the linear density of the read head, is controlled by the sensor stack which includes all of the aforementioned layers as well as a cap layer and first and second lead layers if they are employed with the sensor. With the demand for high linear density read heads, this is a serious design restriction. It should be understood that an increase in the linear density of the read head means that more bits per inch can be read by the read head along the circular track of the magnetic disk which permits an increase in the storage density of a magnetic disk drive.

SUMMARY OF THE INVENTION

The present invention provides a tunnel junction flux guide read head which has a smaller gap between the first and second shield layers at the ABS, as compared to the gap between the first and second shield layers at a recessed tunnel junction sensor. This has been accomplished by extending the free layer of the tunnel junction sensor to the ABS so that the extended free layer serves as the flux conducting layer of the flux guide along with sloping the second shield layer downwardly as it extends from the tunnel junction sensor to the ABS so that the gap between the first and second shield layers at the ABS is less than the gap between the first and second shield layers at the tunnel junction sensor. The sloping of the second shield layer is permitted by employing an insulation layer which has a thickness that is less than the total thickness of milled-away pinning, pinned and spacer layers of the tunnel junction sensor. Depending upon whether the tunnel junction sensor is a top free layer located type of sensor or a bottom free layer located type of sensor, a unique method of construction is employed for providing the free layer extension to the ABS and sloping the second shield layer downwardly so as to decrease the gap between the first and second shield layers at the ABS.

In our invention, the longitudinal bias field is provided by an in-stack longitudinal bias stack (LBS).

Combining this scheme for longitudinal stabilization and the flux guide for preventing shorts between the free and pinned layer, we are able to obtain a gap at the ABS which is much smaller than that of the whole sensor stack so that the invention provides a method for making a narrow gap sensor and enhances the read head linear density. The advantage of this approach can be illustrated by the following: in-stack longitudinal bias has an advantage for improving a sensor's permeability. However, it will increase the total thickness of the sensor at the ABS, i.e. 350 Å for tunnel junction+100 Å for the in-stack, wherein the in-stack bias includes a spacer (20 Å), a longitudinally biased layer, LBL (30 Å) and an antiferromagnetic (AFM) layer (50 Å), so that the thickness of the sensor=350+100=450 Å. The gap is limited by the sensor thickness. However, by using the invention, the part of the sensor at the ABS, the free layer (30 Å) plus the in-stack (100 Å) is only 130 Å.

An object of the present invention is to provide a tunnel junction flux guide read head which has a smaller gap at the ABS where a flux guide is located as compared to the gap at a recessed tunnel junction read head.

Another object is to provide various methods of making the aforementioned tunnel junction guide read head, depending upon whether a tunnel junction sensor is a top located free layer type of sensor or a bottom located free layer type of sensor.

Other objects and attendant advantages of the invention will be appreciated upon reading the following description taken together with the accompanying drawings.

BRIEF DESCRIPTION OF THE DRAWINGS

FIG. 17 is a top view showing formation of the third mask on top of the second shield layer for defining the stripe height of the flux guide;

FIG. 18 is a block diagram illustrating ion milling about the mask in FIG. 17 and the removal of the mask;

FIG. 19 is a top view after lapping to the ABS;

FIG. 21 is a cross-section through another plurality of sensor material layers which are deposited on a wafer (not shown);

FIG. 22 is a top view of the sensor material layers with a first mask formed thereon for defining a stripe height of the flux guide;

FIG. 23 is a block diagram showing ion milling of the cap, depositing alumina and removing the first mask;

DESCRIPTION OF THE PREFERRED EMBODIMENTS

Magnetic Disk Drive

Figure 1:
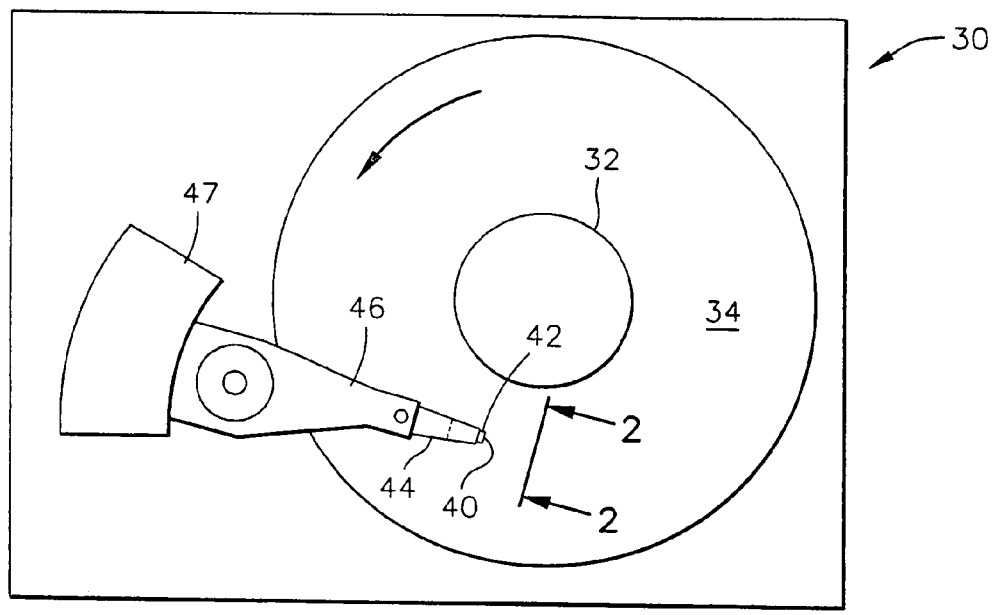
FIG. 1 is a plan view of an exemplary magnetic disk drive.
Figure 2:
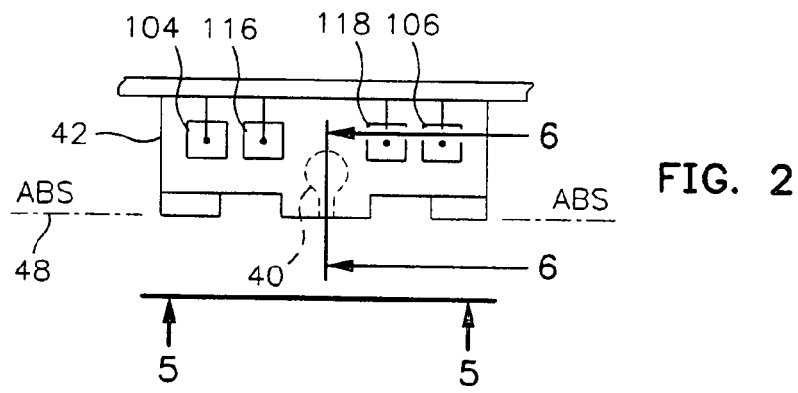
FIG. 2 is an end view of a slider with a magnetic head of the disk drive as seen in plane 2—2 of FIG. 1.
Figure 3:
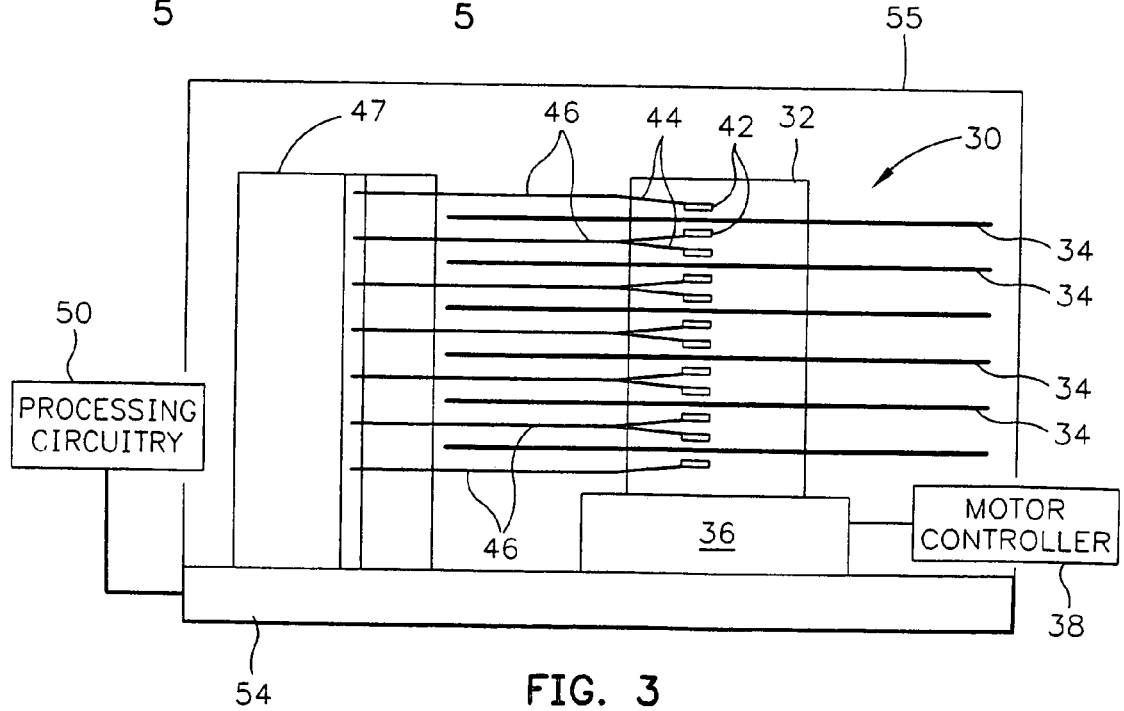
FIG. 3 is an elevation view of the magnetic disk drive wherein multiple disks and magnetic heads are employed.
Figure 4:
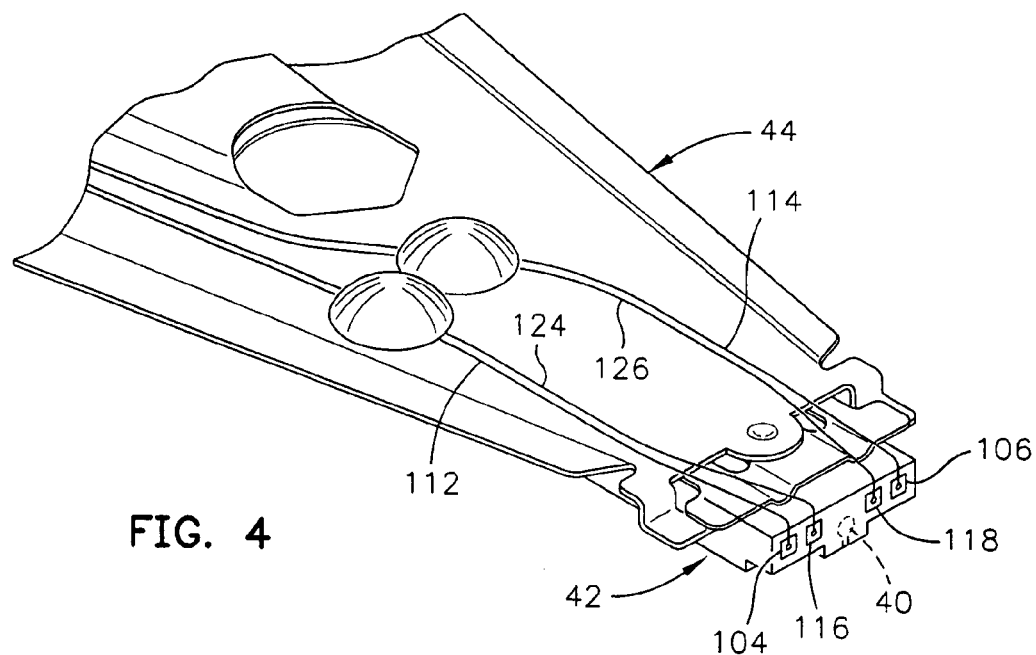
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a spindle motor 36 that is controlled by a motor controller 38. A slider 42 has a combined read and write magnetic head 40 and is supported by a suspension 44 and actuator arm 46 that is rotatably positioned by an actuator 47. A plurality of disks, sliders and suspensions may be employed in a large capacity direct access storage device (DASD) as shown in FIG. 3. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin (typically, 0.05 μm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides spindle motor drive signals for rotating the magnetic disk 34, and provides control signals to the actuator for moving the slider to various tracks. In FIG. 4 the slider 42 is shown mounted to a suspension 44. The components described hereinabove may be mounted on a frame 54 of a housing 55, as shown in FIG. 3.

Figure 5:
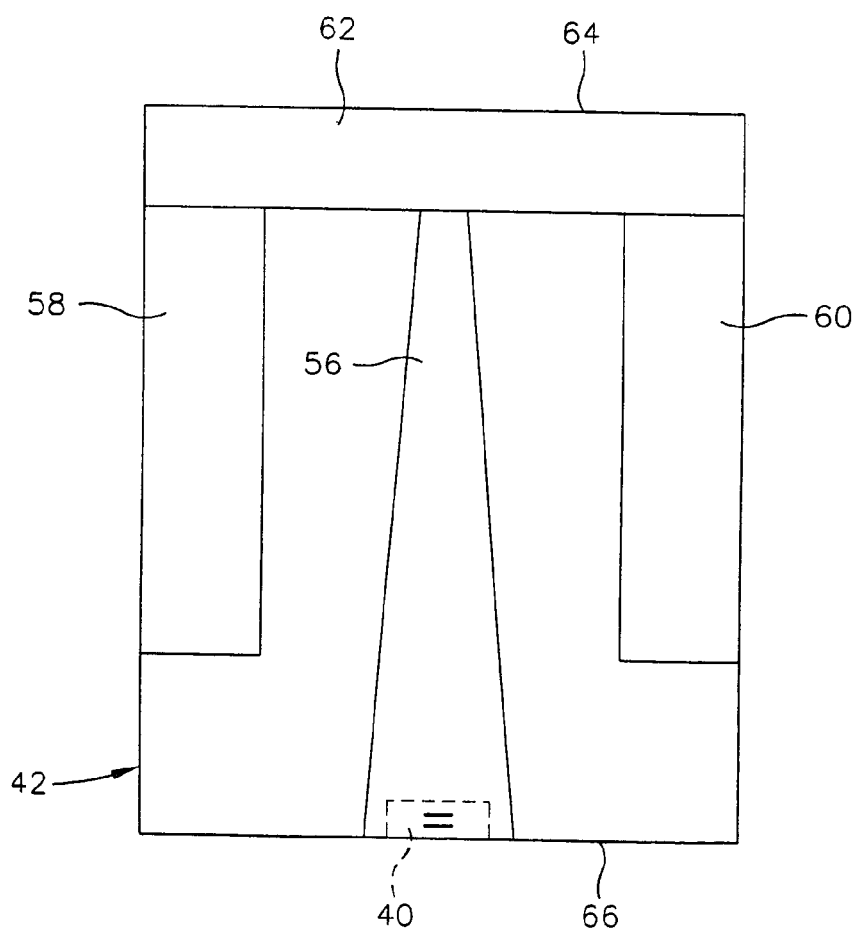
FIG. 5 is an ABS view of the magnetic head taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 6:
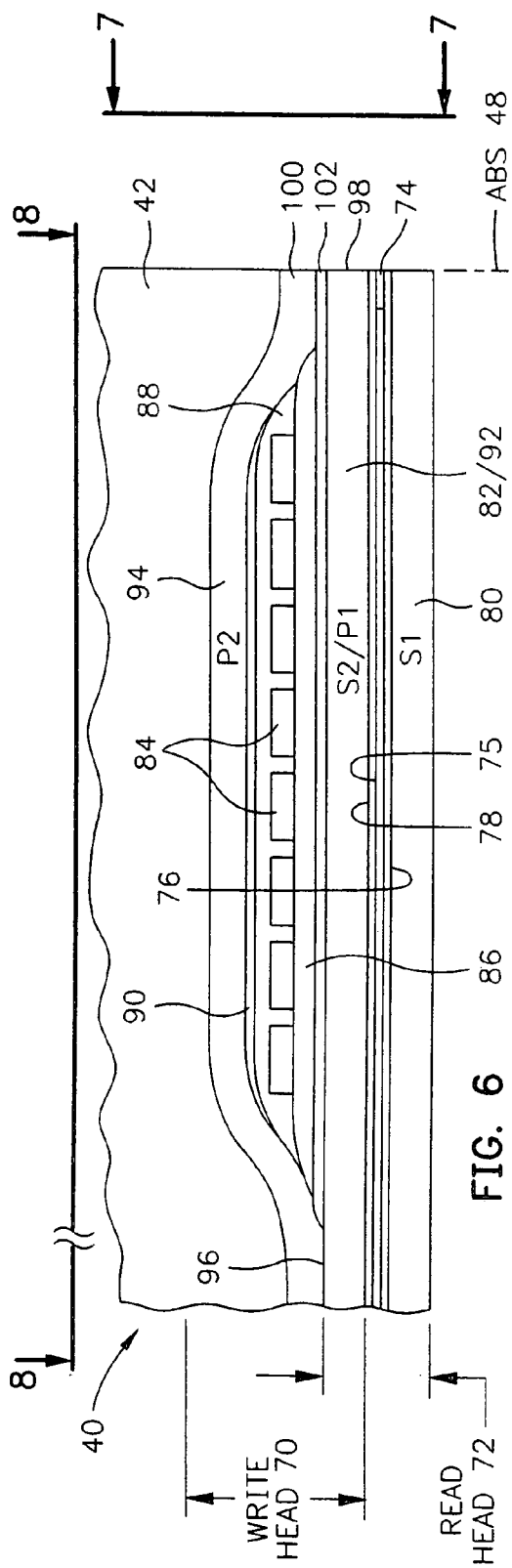
FIG. 6 is a partial view of the slider and a merged magnetic head as seen in plane 6—6 of FIG. 2.
Figure 8:
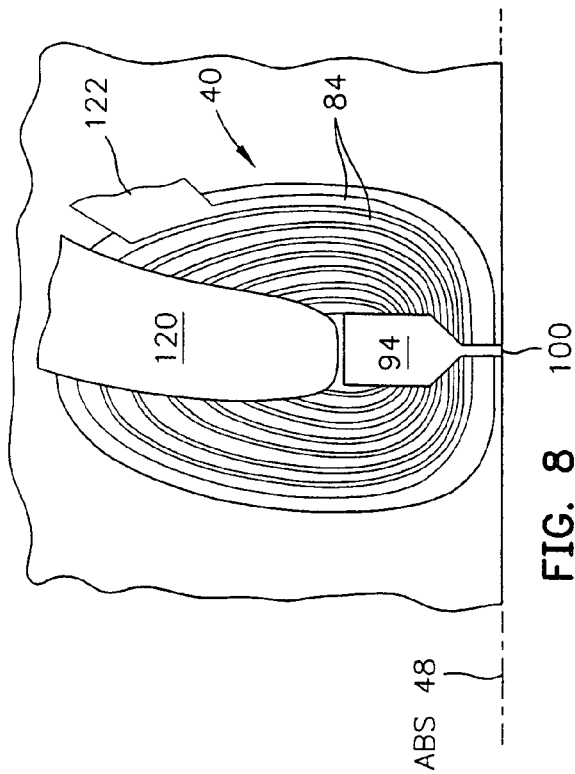
FIG. 8 is a view taken along plane 8—8 of FIG. 6 with all material above the coil layer and leads removed.
Figure 7:
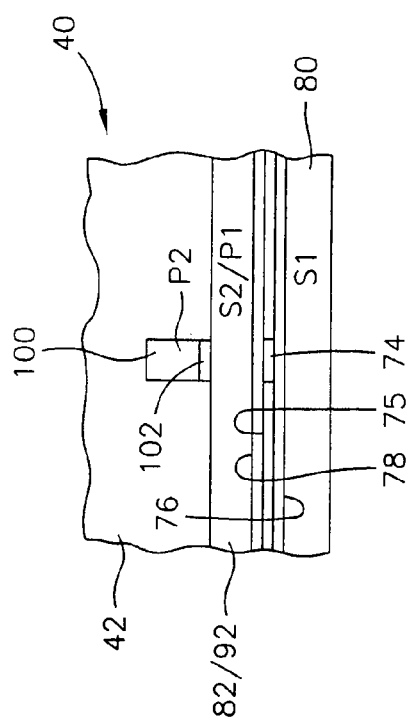
FIG. 7 is a partial ABS view of the slider taken along plane 7—7 of FIG. 6 to show the read and write elements of the merged magnetic head.

FIG. 6 is a side cross-sectional elevation view of a merged magnetic head 40, which includes a write head portion 70 and a read head portion 72, the read head portion employing a tunnel junction sensor and flux guide 74 of the present invention. FIG. 7 is an ABS view of FIG. 6. The tunnel junction sensor and flux guide 74 and an insulation layer 75 may be sandwiched between first and second lead layers 76 and 78 which, in turn, are sandwiched between ferromagnetic first and second shield layers 80 and 82. In response to field signals from the rotating disk, the resistance of the spin valve sensor changes. A tunneling current ($I_T$) conducted through the sensor causes these resistance changes to be manifested as potential changes. These potential changes are then processed as readback signals by the processing circuitry 50 shown in FIG. 3. The tunneling current ($I_T$) may be conducted through the tunnel junction sensor perpendicular to the planes of its thin film surfaces by the first and second shield layers 80 and 82 and the first and second lead layers 76 and 78. In a piggyback head the second shield layer and the first pole piece layer are separate layers which are separated by a nonmagnetic isolation layer.

The write head portion 70 of the magnetic head 40 includes a coil layer 84 which is sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 10) to leads 124 and 126 on the suspension.

Figure 20:
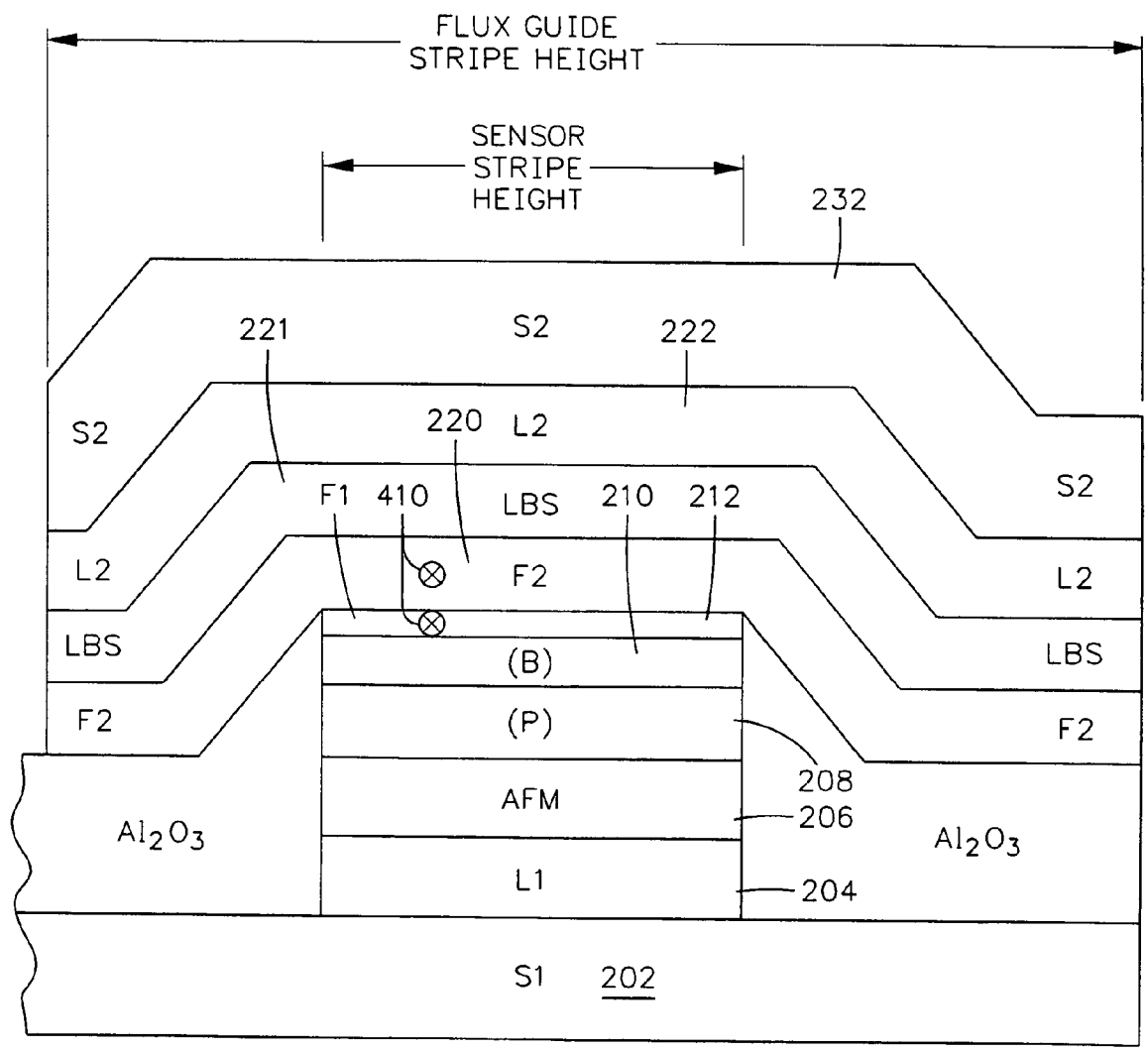
FIG. 20 is a view taken along plane 20—20 of FIG. 19.
Figure 30:
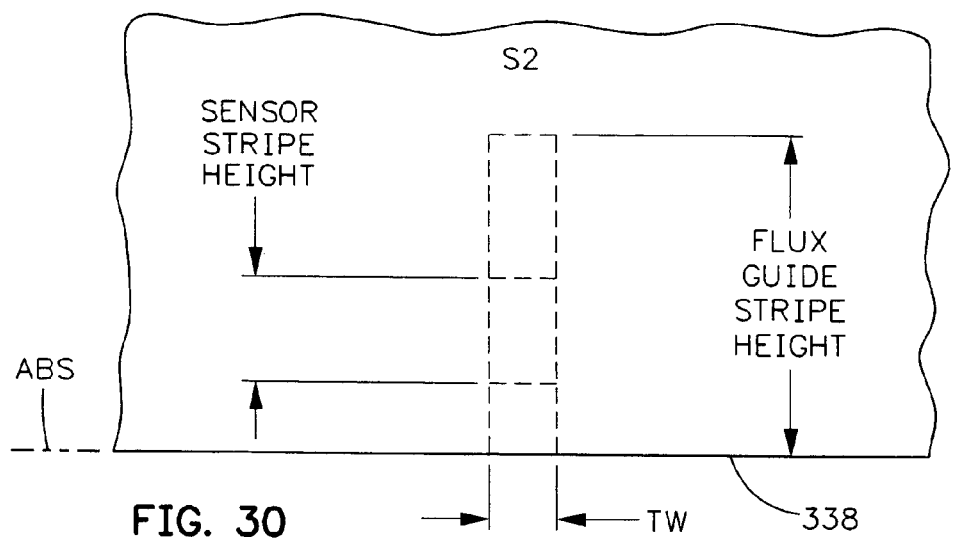
FIG. 30 is a top view after lapping to form the ABS.
Figure 31:
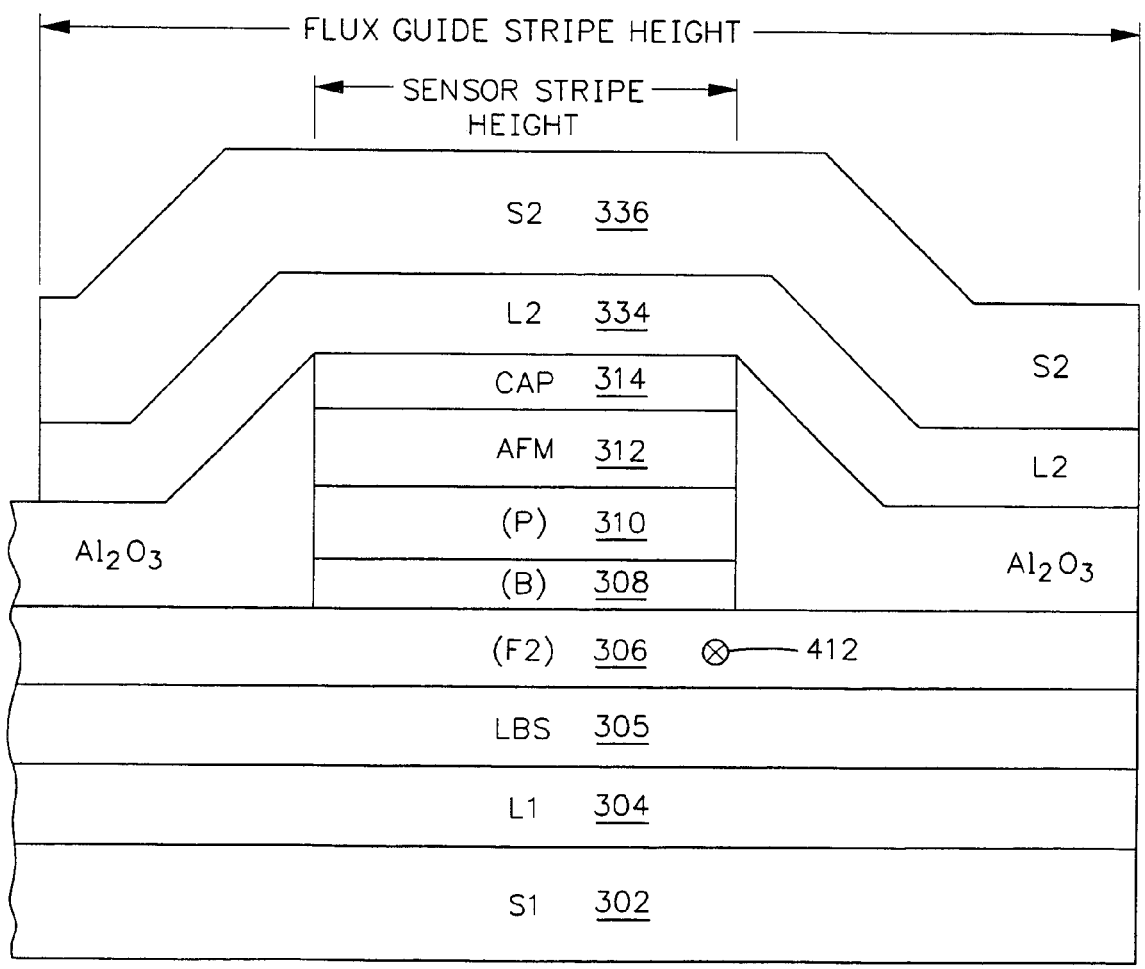
FIG. 31 is a cross-section of the final structure after lapping.

Longitudinal cross-sections of two embodiments of the present invention are illustrated in FIGS. 20 and 31 wherein, in FIG. 20, a magnetic head assembly is shown which has a flux guide at the ABS and a recessed tunnel junction sensor with a top located free layer 212, and FIG. 31 shows a magnetic head assembly with a flux guide at the ABS and a recessed tunnel junction sensor with a bottom located free layer 306. The magnetic head assembly in FIG. 20 is made by various steps shown in FIGS. 9–19 and the magnetic head assembly in FIG. 31 is made by various steps shown in FIGS. 21–30. In each of the methods of making, as shown in FIGS. 9–19 or FIGS. 21–30, various layers may be formed on a wafer (not shown) by various sputtering techniques, such as ion beam sputtering or magnetron sputtering which are well known in the art, various masks may be formed, such as photoresist masks on the layers, milling may be implemented to remove exposed portions of the layers about the mask and the mask is then removed. The mask may be formed by first spinning a layer of photoresist on the layers, exposing the photoresist mask to light in areas that are to be removed, assuming that the photoresist is a positive photoresist, and then exposing the photoresist to a developer which removes the exposed portions of the mask.

In a preferred embodiment of each method, bilayer photoresist masks are employed wherein each bilayer photoresist mask has top and bottom portions with the bottom portion being recessed with respect to the top portion. This type of mask is formed by spinning bottom and top photoresist layers on the wafer wherein the bottom layer has a preferential dissolution rate with respect to the top photoresist layer. The top photoresist layer has a preferential exposure to light imaging with respect to the bottom photoresist layer. After light imaging the layers, a developer removes the light imaged portion of the top photoresist layer and then preferentially dissolves the bottom photoresist layer causing an undercut below the top photoresist layer. After the bilayer photoresist is formed, milling, such as ion milling, is employed for removing all exposed portions of layers about the bilayer photoresist mask, one or more layers of desired materials are then deposited about the mask as well as on top of the mask and then the mask is subjected to a developer which dissolves the bottom photoresist layer of the bilayer mask resulting in the mask being lifted off the wafer along with deposited layers formed thereon. It should be understood that a plurality of magnetic head assemblies are typically formed in rows and columns on a wafer by the above techniques after which the wafer is diced into rows of magnetic head assemblies. Each row of magnetic head assemblies is then lapped to the air bearing surface and each row of magnetic head assemblies is then diced into individual magnetic head assemblies. The magnetic head assemblies are then mounted on suspensions for use in a magnetic disk drive. The methods described hereinbelow illustrate the fabrication of individual magnetic head assemblies out of a plurality of such magnetic head assemblies in the aforementioned rows and columns.

First Method of the Present Invention

Figure 9:
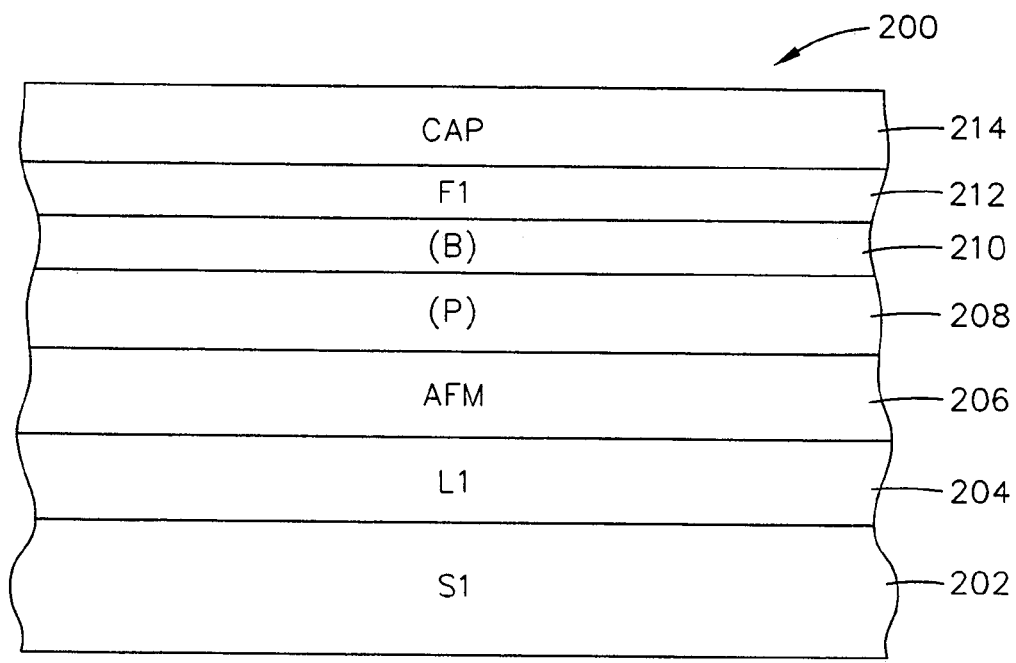
FIG. 9 is a cross-section of sensor material layers which have been formed on a wafer (not shown)
Figure 10:
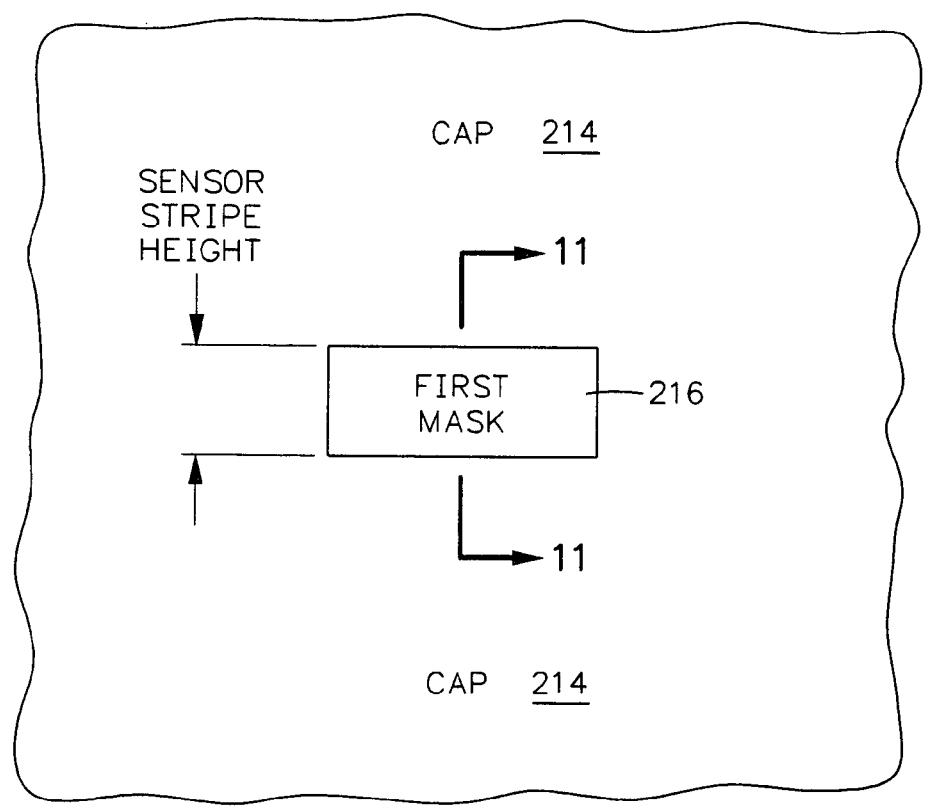
FIG. 10 is a top view of the sensor material layers with a mask formed thereon for defining a sensor stripe height.
Figure 11:
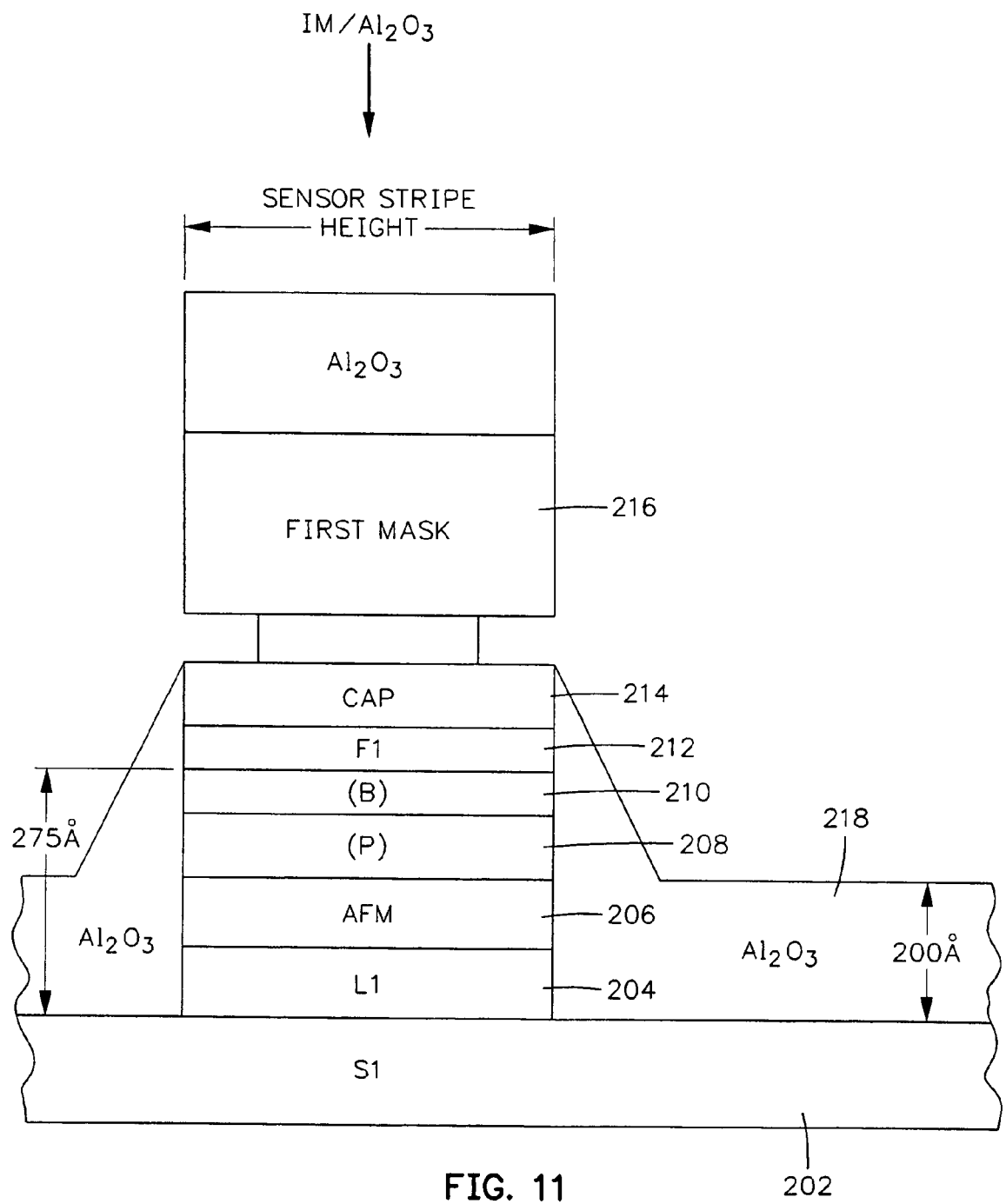
FIG. 11 is a view taken along plane 11—11 of FIG. 10.
Figure 12:
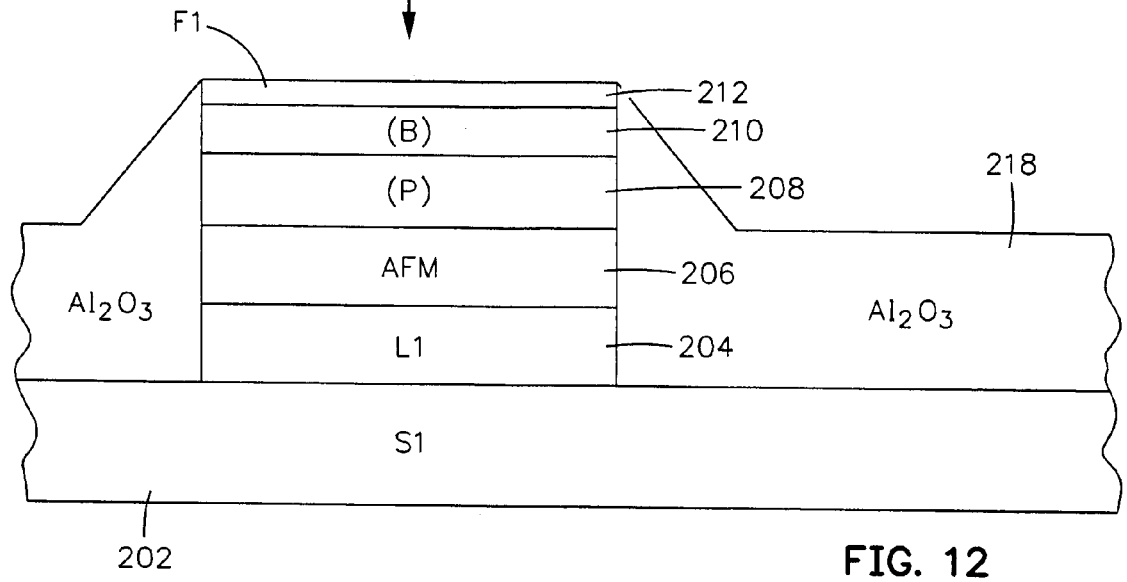
FIG. 12 is the same as FIG. 11 except the mask has been removed, the cap layer has been etched away and an alumina layer has been formed.
Figure 13:
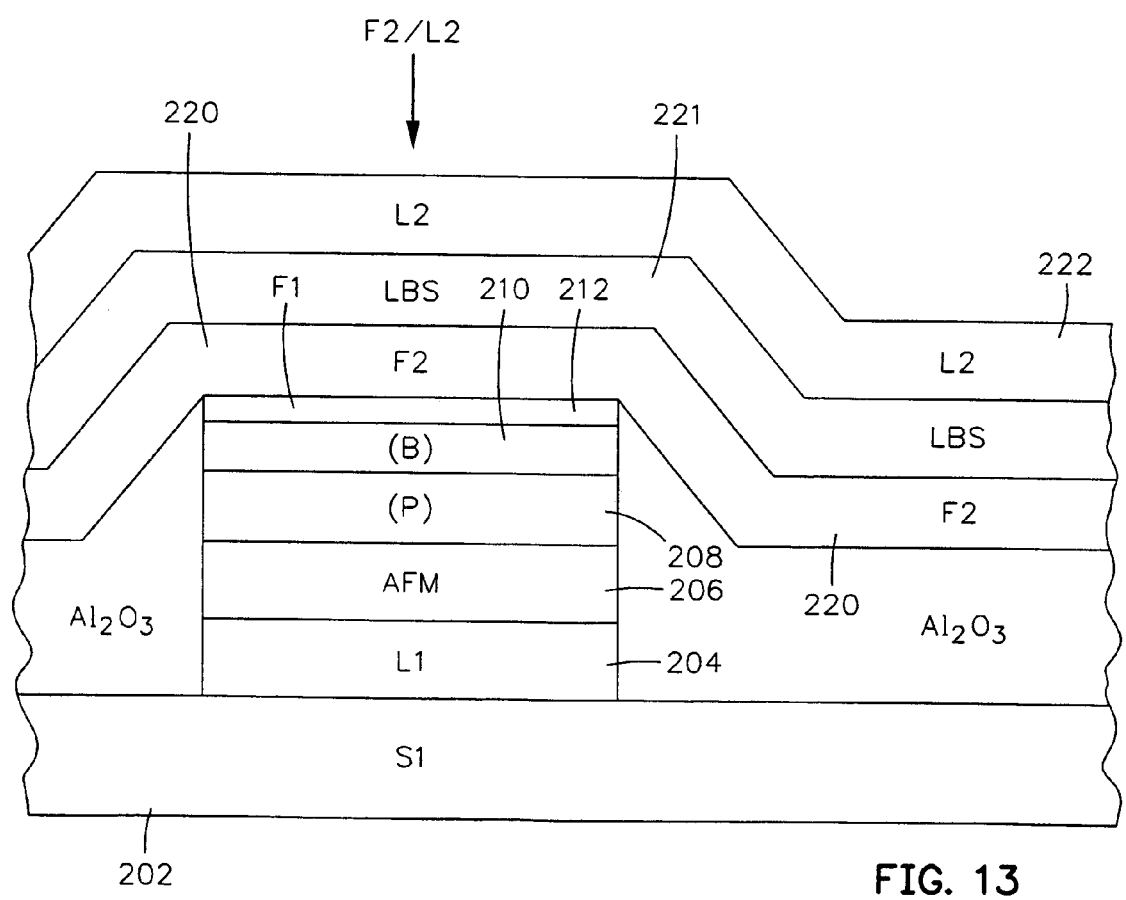
FIG. 13 is the same as FIG. 12 except a second free layer and a second lead layer have been formed.
Figure 32:
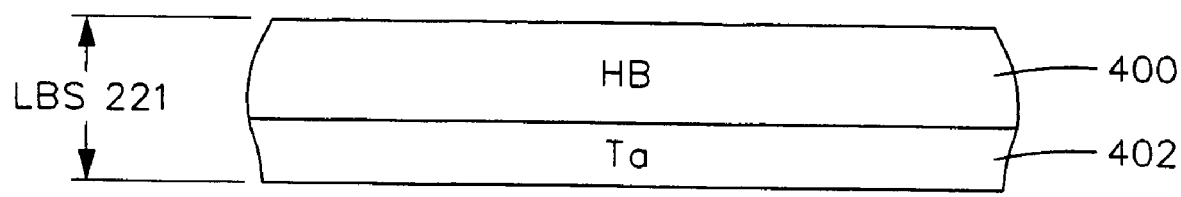
FIG. 32 is an ABS view of one embodiment of the LBS.
Figure 33:
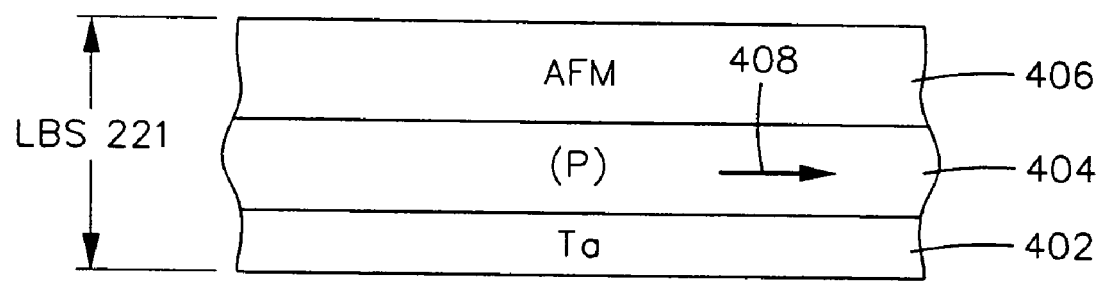
FIG. 33 is an ABS view of another embodiment of the LBS.
Figure 34:
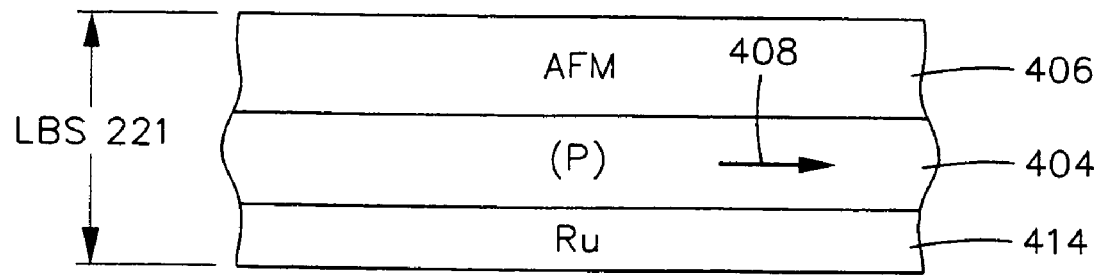
FIG. 34 is an ABS view of still another embodiment of the LBS.

In FIG. 9 a plurality of sensor material layers 200 are formed on a wafer (not shown). The sensor material layers may include a first shield layer (S1) 202, which may be the same as the first shield layer 80 in FIGS. 6 and 7, a first lead layer (L1) 204, an antiferromagnetic (AFM) pinning layer 206, a pinned layer (P) 208, a barrier layer (B) 210, a first free layer (F1) 212 and a cap layer 214, such as tantalum (Ta), for protecting the layers therebelow from subsequent processing steps. In FIG. 10 a first bilayer photoresist mask 216 is formed on top of the cap layer 214 for defining a stripe height of the sensor. In FIG. 11 the sensor material layers exposed about the mask 216 are removed down to the first shield layer 202 and then the wafer is backfilled with alumina ($AL_2O_3$). The thickness of the alumina layer 218 in FIG. 11, such as 200 Å, is less than the total thickness, such as 275 Å, of the milled-away sensor material layers comprising the first lead layer 204, the pinning layer 206, the pinned layer 208, the barrier layer 210, the free layer 212 and the cap layer 214. This is important for reducing the gap between the first shield layer 202 and a second shield layer at the ABS, as compared to a gap between the first shield layer 202 and the second shield layer at the sensor, which will be described in more detail hereinafter. After removing the first mask 216, the wafer is subjected to sputter etching which removes a portion of the first free layer 212 and portions of the backfilled alumina layer 218, as shown in FIG. 12. A second free layer (F2) 220, a longitudinal bias stack (LBS) 221 and a second lead layer (L2) 222 are then formed on the wafer, as shown in FIG. 13. Exemplary embodiments of the LBS are illustrated in FIGS. 32, 33 and 34.

Figure 14:
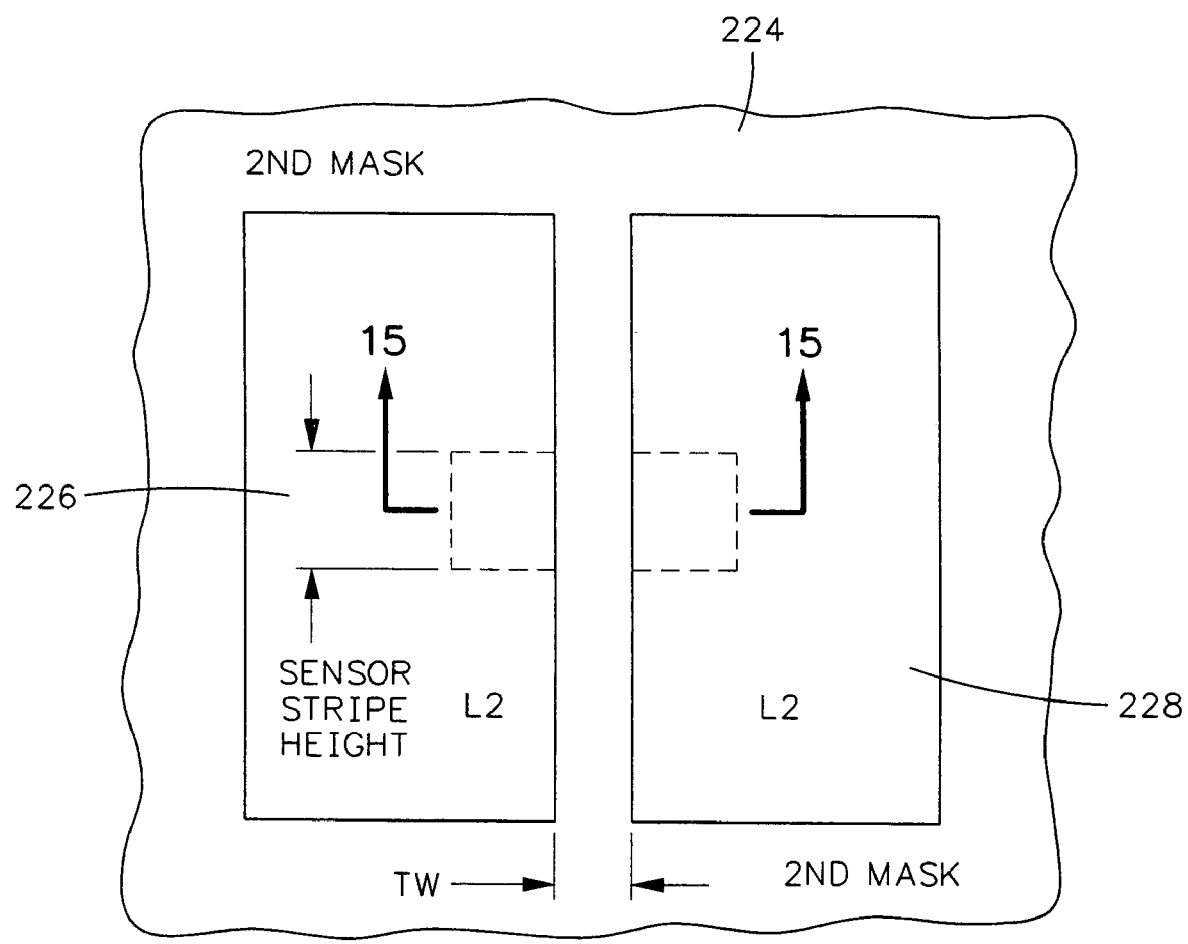
FIG. 14 is a top view of FIG. 13 after a mask has been formed for defining the track width of the sensor.
Figures 15, 16:
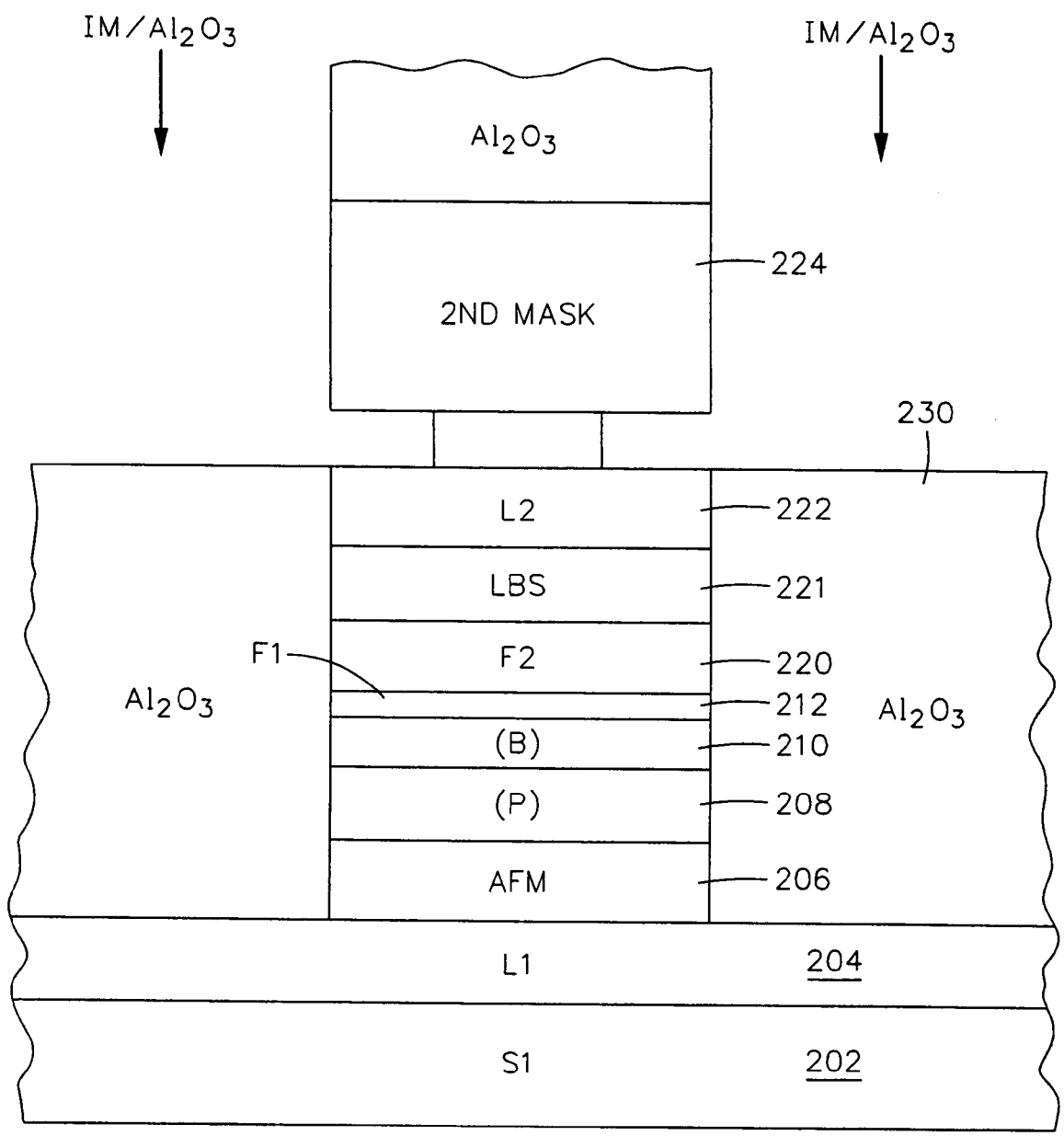
FIG. 15 is a view taken along plane 15—15 of FIG. 14.
FIG. 16 is a block diagram illustrating the removal of the mask in FIG. 15 and the deposition of the second shield layer.

A second bilayer photoresist mask 224 is then formed on the wafer with openings 226 and 228 for defining a track width of the sensor, as shown in FIG. 14. Ion milling (IM) is then implemented to remove exposed portions of the sensor material layers in the openings 226 and 228 down to the first lead layer 204, as shown in FIG. 15, or optionally just passing the barrier layer 210, and then the wafer is backfilled with an alumina layer 230. As shown in FIG. 16, the second mask 224 is removed and then a second shield layer (S2) 232 is formed on the wafer which may be the same as the second shield layer 82 shown in FIGS. 6 and 7.

In FIG. 17 a third bilayer photoresist mask 234 is formed on the second shield layer 232 for defining a back edge 236 of the flux guide. As shown in FIGS. 18 and 20, ion milling is implemented to remove exposed portions of the sensor material layers down to the first shield layer 202 and then the third mask 234 is removed. In FIG. 19 the wafer is lapped to the ABS which defines the front edge of the flux guide. A longitudinal cross-section of the resulting flux guide and recessed sensor are illustrated in FIG. 20. It can be seen in FIG. 20 that the distance between the first and second shield layers 202 and 232 at the ABS is less than the distance between the first and second shield layers at the sensor.

Second Method of the Present Invention

In FIG. 21 a plurality of sensor material layers 300 are formed on the wafer (not shown). The sensor material layers 300 may include a first shield layer (S1) 302, which is the same as the first shield layer 80 shown in FIGS. 6 and 7, a first lead layer (L1) 304, a longitudinal bias stack (LBS) 305, a free layer (F) 306, a barrier layer (B) 308, a pinned layer (P) 310, an antiferromagnetic (AFM) layer 312 and a cap layer 314.

Figure 24:
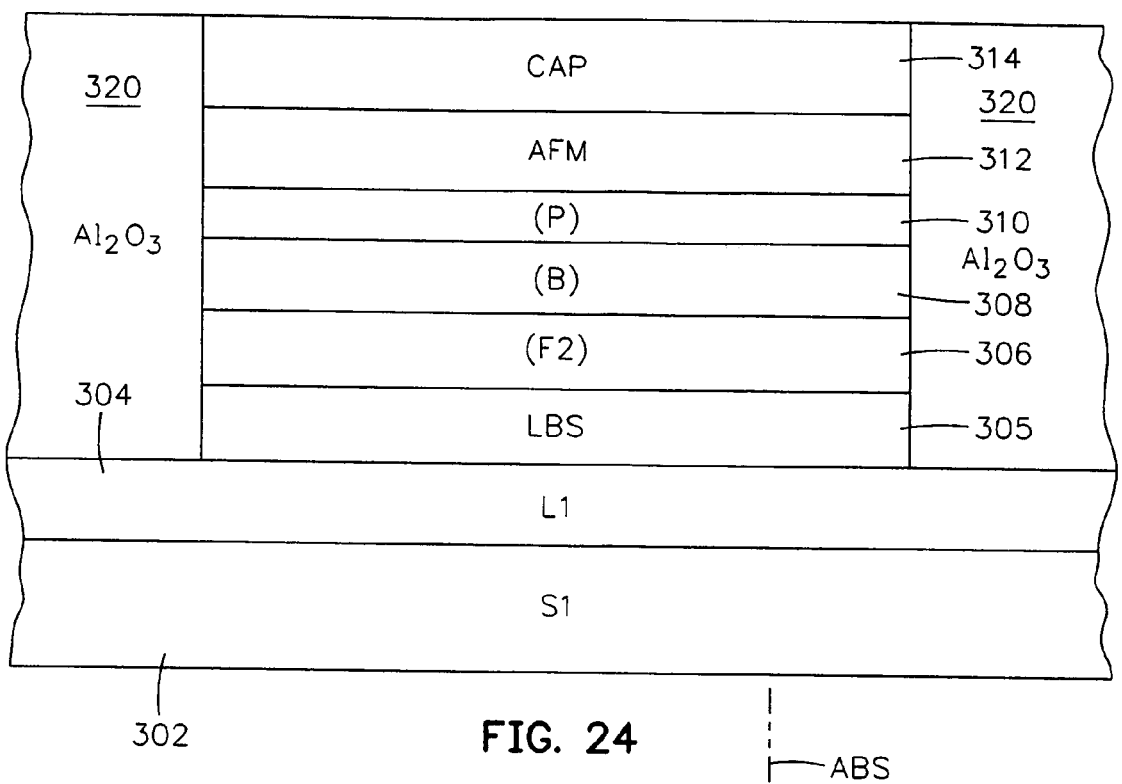
FIG. 24 is a cross section through the sensor material layers after the steps in FIG. 23.

In FIG. 22 a first bilayer photoresist mask 316 is formed on the cap layer 314 for defining a back edge 318 of the flux guide. In FIG. 23 the wafer is ion milled (IM) to remove all portions of the sensor material layers about the mask 316 which passes the barrier layer 310, an alumina layer 320 has been formed and the first mask 316 has been removed. The resulting structure is illustrated in FIG. 24.

Figure 25:
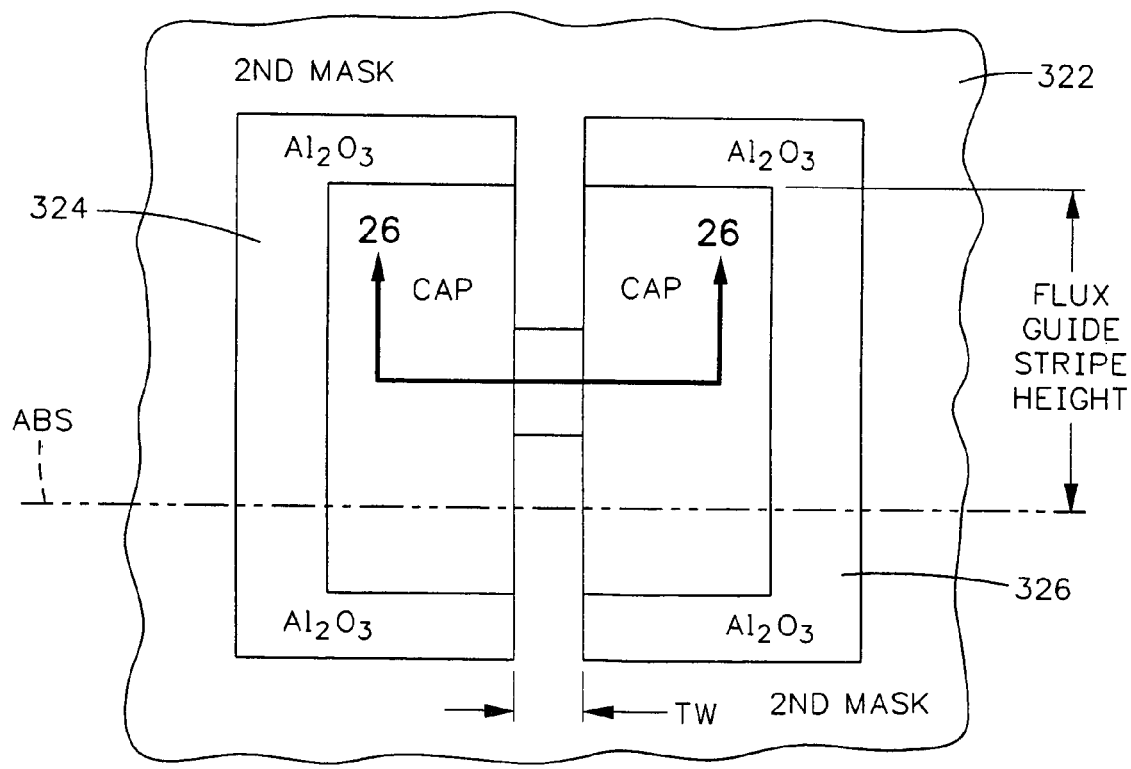
FIG. 25 is a top view of FIG. 24 after forming a second mask for defining a track width of the read head.
Figure 26:
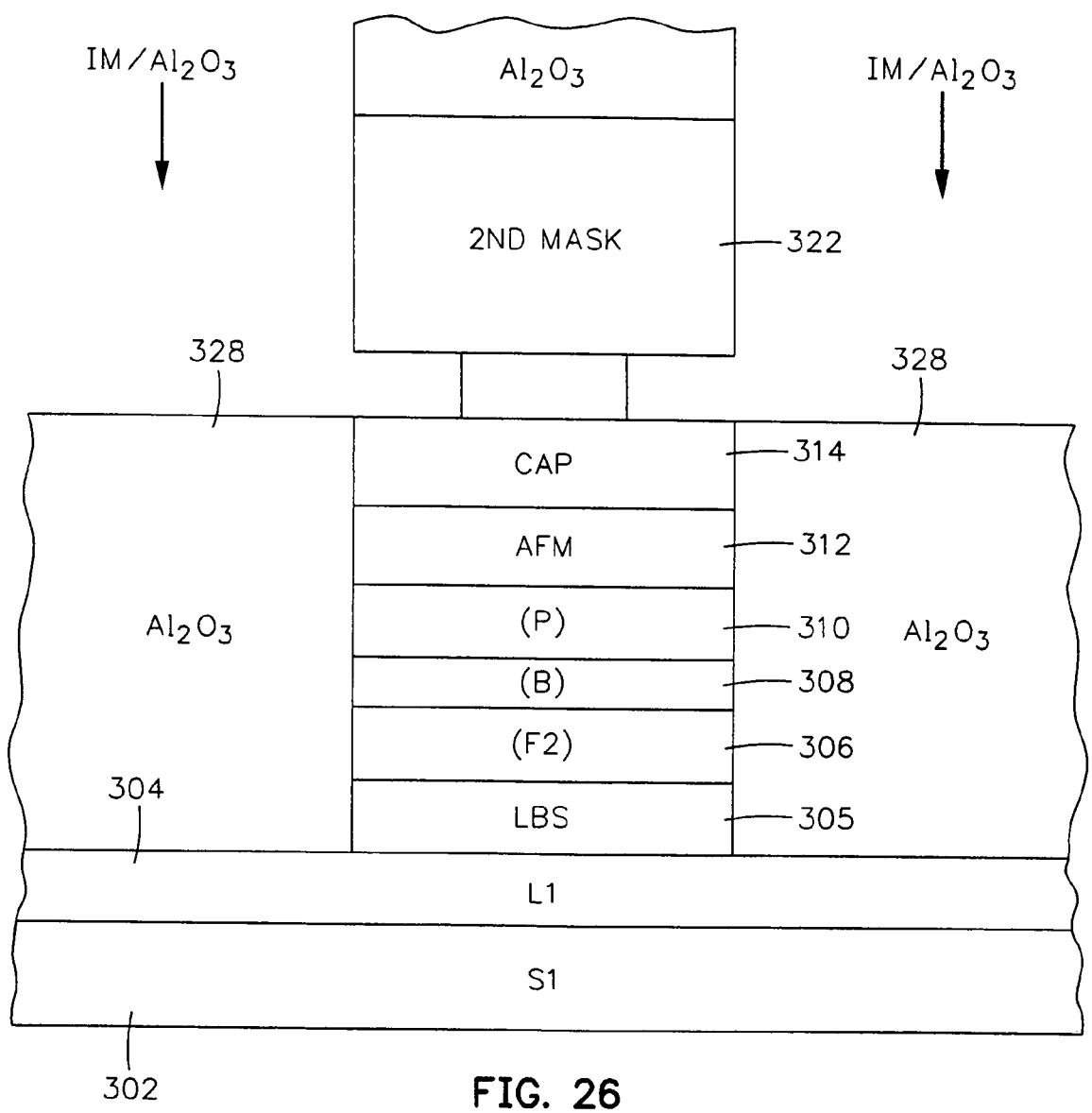
FIG. 26 is a view taken along plane 26—26 of FIG. 25.

In FIG. 25 a second bilayer photoresist mask 322 has been formed with openings 324 and 326 for defining a track width (TW) of the sensor and flux guide. As shown in FIG. 26, ion milling (IM) is then employed for removing all exposed portions of the sensor material layers passing at least the barrier layer 310 and optionally down to the first shield layer 302. The wafer is then backfilled with an alumina layer (Al$_2$O$_3$) 328.

Figure 27:
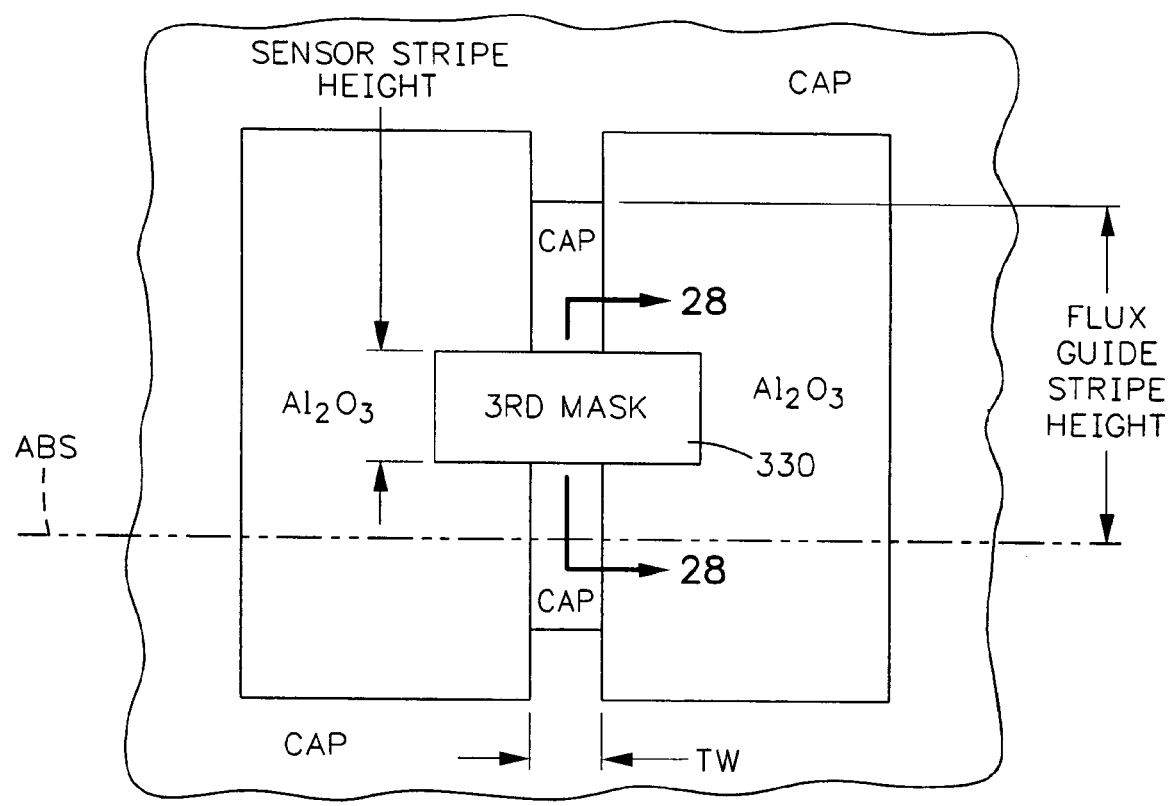
FIG. 27 is a top view of FIG. 26 after removal of the second mask and formation of a third mask for forming a stripe height of the sensor.
Figures 28, 29:
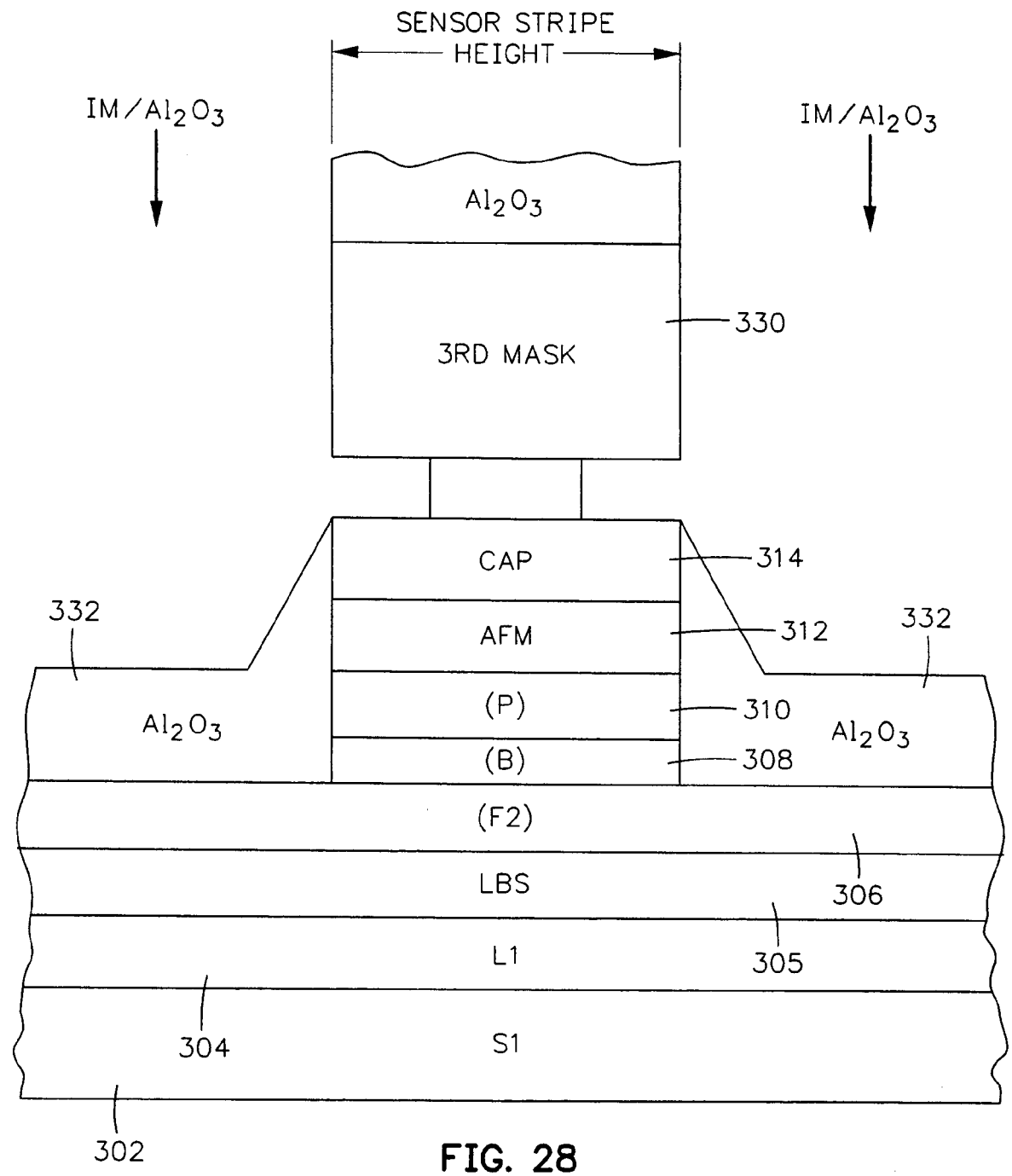
FIG. 28 is a view taken along plane 28—28 of FIG. 27.
FIG. 29 is a block diagram showing removal of the third mask in FIG. 28 and depositing the second lead and the second shield layer.

In FIG. 27 a third bilayer photoresist mask 330 is formed on the wafer for defining the stripe height of the sensor. In FIG. 28 ion milling (IM) is implemented for removing exposed sensor material layers down to the free layer 306 and the wafer is then backfilled with an alumina layer 332 which has a thickness that is less than a total thickness of the barrier layer 308, the pinned layer 310, the pinning layer 312 and the cap layer 314. This reduced thickness is key to reducing the gap between first and second shield layers at the ABS, as compared to the gap between the first and second shield layers at the sensor, which is described hereinafter.

In FIG. 29 the third mask 330 is removed and a second lead layer (L2) 334 and a second shield layer (S2) 336 are formed on the wafer, as shown in FIG. 31. In FIG. 30 the wafer is lapped to the ABS which defines a front edge 338 and stripe height of the flux guide as well as the ABS. A longitudinal cross-sectional view through the resulting structure is illustrated in FIG. 31 which shows that the distance between the first and second shield layers 302 and 336 at the ABS is less than the distance between the first and second shield layers 302 and 336 at the sensor. This reduced gap increases the linear bit read density of the read head. It should also be noted that the flux guide and the sensor have a common free layer 306 with the free layer portion between the ABS and the sensor serving as a flux guide for conducting field signals from the rotating magnetic disk to the free layer portion in the sensor.

Longitudinal Biasing Stacks (LBS)

FIGS. 32, 33 and 34 illustrate various embodiments of the longitudinal bias stack (LBS) 221 which may be employed in the read head embodiment shown in FIG. 20. FIG. 32 shows a first embodiment of the LBS 221 which has a hard bias layer (HB) 400 and a nonmagnetic spacer layer 402 which may be Ta. The spacer layer 402 is located between the hard bias layer 400 and the one or more free layers in FIG. 20. In this embodiment the hard bias layer 400 exerts a field from its ends to magnetostatically bias the free layer(s) parallel to the ABS. A second embodiment of the LBS 221, which is illustrated in FIG. 33, is the same as the embodiment shown in FIG. 32 except a ferromagnetic pinning layer (P) 404 is located on the spacer layer 402 and an antiferromagnetic (AFM) pinning layer 406 is located on and exchange coupled to the pinned layer. The pinning layer 406 pins a magnetic moment 408 of the pinned layer parallel to the ABS and parallel to the major thin film planes of the layers with a magnetic moment 410 of the free layers 212 and 220 in FIG. 20 pinned antiparallel to the magnetic moment 408, in the same manner as described hereinabove. The embodiment of the LBS 221 shown in FIG. 34 is the same as the bias stack shown in FIG. 33 except a ruthenium (Ru) layer 414 is substituted for the tantalum (Ta) spacer layer 402. The Ru layer 414 is sufficiently thin (i.e. 8 Å) to cause an antiparallel coupling between the pinned layer 404 and the one or more free layers. It should be understood that a reverse order of the layers of the LBS 221 shown in FIGS. 32, 33 and 34 is employed for various embodiments of the LBS 305 shown in FIG. 31.

Discussion

It should be understood that in each of the embodiments the first and second lead layers (L1) and (L2) may be omitted with the first and second shield layers (S1) and (S2) serving as first and second leads for conducting a tunneling current through the sensor material layers perpendicular to their thin film planes. It should also be understood that the barrier layer (B) in each of the embodiments may be a spacer layer which is formed from a nonmagnetic conductive material such as copper. Either type of sensor is a current perpendicular to the plane (CPP) type of spin valve sensor. The ferromagnetic layers may be constructed of a material such as nickel iron (NiFe) and the antiferromagnetic pinning layer may be constructed of a conductive antiferromagnetic material such a nickel manganese (NiMn). It should further be understood that in lieu of depositing alumina layers 230 and 328 in FIGS. 15 and 26 a very thin alumina layer (not shown) may be deposited followed by depositing a hard bias layer (not shown) on each side of the sensor for longitudinally biasing and stabilizing the free layer of the sensor. It should also be understood that other materials may be used in place of the alumina, such as silicon dioxide (SiO$_2$).

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

We claim:

1. A method of making a read head that has an air bearing surface (ABS) comprising the steps of:
    forming a ferromagnetic first shield layer;
    forming a plurality of sensor material layers on the first shield layer;
    forming a first mask on the sensor material layers recessed from the ABS for defining a stripe height of a read sensor;
    milling exposed portions of the sensor material layers and back filling with a first insulation that has a thickness less than a thickness of the sensor material layers milled away;
    removing the first mask;
    forming a ferromagnetic free material layer on the remaining sensor material layers and the first insulation layer;
    forming a longitudinal biasing stack (LBS) material layer on the free material layer;
    forming a second mask on the LBS material layer recessed from the ABS for defining a track width of the read sensor and a flux guide;
    milling away all exposed portions of the LBS and free material layers to form said track width and back filling with a second insulation layer;
    removing the second mask;
    forming a third mask on a remaining LBS material layer defining a back edge of the flux guide wherein the read head is located between the ABS and said back edge;
    milling away all exposed LBS and free material layers and back filling with a third insulation layer;
    removing the third mask;
    forming a second shield layer on the remaining LBS and free material layers; and
    lapping all remaining layers to form said ABS with the flux guide having a front edge located at the ABS.

2. A method as claimed in claim 1 wherein the forming of the sensor material layers further includes the steps of:
    forming an antiferromagnetic pinning layer on the first shield layer;
    forming a ferromagnetic pinned layer exchange coupled to the pinning layer; and
    forming a spacer layer on the pinned layer.

* * * * *